(12) United States Patent
Zei

(10) Patent No.: US 12,283,949 B2
(45) Date of Patent: Apr. 22, 2025

(54) OPERATING UNIT FOR A DOMESTIC APPLIANCE

(71) Applicant: BSH Hausgeräte GmbH, Munich (DE)

(72) Inventor: Carsten Zei, Sinzing (DE)

(73) Assignee: BSH Hausgeraete GmbH, Munich (DE)

( * ) Notice: Subject to any disclaimer, the term of this patent is extended or adjusted under 35 U.S.C. 154(b) by 0 days.

(21) Appl. No.: 18/009,076

(22) PCT Filed: May 25, 2021

(86) PCT No.: PCT/EP2021/063850
§ 371 (c)(1),
(2) Date: Dec. 8, 2022

(87) PCT Pub. No.: WO2021/249763
PCT Pub. Date: Dec. 16, 2021

(65) Prior Publication Data
US 2023/0216498 A1    Jul. 6, 2023

(30) Foreign Application Priority Data

Jun. 8, 2020   (DE) .................... 10 2020 207 158.6

(51) Int. Cl.
*H03K 17/96*   (2006.01)
(52) U.S. Cl.
CPC . *H03K 17/9622* (2013.01); *H03K 2017/9602* (2013.01); *H03K 2217/96079* (2013.01)
(58) Field of Classification Search
CPC ....... H03K 17/9622; H03K 2017/9602; H03K 2217/96079; H03K 2217/960785
See application file for complete search history.

(56) References Cited

U.S. PATENT DOCUMENTS

| | | | |
|---|---|---|---|
| 2015/0123569 A1* | 5/2015 | Knaapen ................. | F21S 10/02 315/297 |
| 2015/0206669 A1* | 7/2015 | Hauck .................. | H03K 17/962 29/622 |
| 2015/0269407 A1* | 9/2015 | Chou .................. | G06V 40/1329 382/124 |
| 2016/0014894 A1* | 1/2016 | Endo ........................ | H05K 1/11 174/257 |
| 2016/0328039 A1* | 11/2016 | Lin ........................ | G06F 3/0443 |
| 2020/0066659 A1* | 2/2020 | Lambert ........... | H01L 23/49582 |
| 2022/0214486 A1* | 7/2022 | Isojima .................... | G02B 1/14 |

FOREIGN PATENT DOCUMENTS

| | | | | |
|---|---|---|---|---|
| DE | 102015201427 A1 * | 7/2016 | ............. | D06F 34/32 |
| EP | 3280053 A2 | 2/2018 | | |

* cited by examiner

*Primary Examiner* — Amine Benlagsir
(74) *Attorney, Agent, or Firm* — Laurence A. Greenberg; Werner H. Stemer; Ralph E. Locher

(57) ABSTRACT

An operating unit for a domestic appliance has a touch-sensitive unit and an LED unit positioned on the rear thereof. The touch-sensitive unit is formed with a diffuser foil which has a top side, facing an operator, provided with a printed character layer and an underside, directed away therefrom, provided with a printed functional layer. This leads to a simpler structure of the operating unit with a smaller number of components, which permits a cost-optimized manufacturing process, and also a higher display contrast with the simultaneous reduction of undesirable reflection effects.

11 Claims, 3 Drawing Sheets

OPERATING UNIT FOR A DOMESTIC APPLIANCE

FIELD AND BACKGROUND OF THE INVENTION

The invention relates to an operating unit for a household appliance having a touch-sensitive unit and an LED unit positioned on the rear thereof.

A variety of operating units for household appliances are known from the prior art. In the simplest case, a household appliance is operated by pushbuttons or rotary switches, the position of which is visible from markings on a panel. The use of unlit membrane keys on microwave ovens, for example, is also known. Also known are touch-sensitive buttons grouped around a small LCD display, the current function of each of which is indicated to the user by a symbol.

EP 3 280 053 A2 discloses an operating module for a household appliance, in particular a hob. The previously known operating module has a symbol foil applied to a mounting surface of a support with at least one touch-sensitive touchpad. The at least one mounting surface has an illuminated area beneath the at least one touchpad. Each of the at least one touchpads also has a metal layer with at least one recess for forming a symbol. Furthermore, the metal layer is electrically conductively connected to an electrical connection of the character foil. One of the disadvantages is that apart from the symbol foil a further diffuser foil is needed to equalize the lighting.

SUMMARY OF THE INVENTION

One object of the invention is to specify an operating unit with a simplified structural design compared to previously known solutions and improved readability.

The aforementioned object is achieved in that the touch-sensitive unit is formed with a diffusor foil, the top side of which, facing an operator, is provided with a printed character layer and the underside of which, directed away therefrom, is provided with a printed functional layer. This leads to a simpler and particularly robust structure of the operating unit, which allows a significant cost reduction. Furthermore, due to the fact that essentially only one diffusor foil printed on both sides is required as the primary function component, better optical perceptibility of the operating unit results for a user, particularly under difficult external lighting conditions. The diffusor foil also serves to equalize the light emitted by the LED unit, which is equipped with a plurality of discrete light-emitting diodes.

The character layer and the functional layer of the diffusor foil are preferably formed by screen printing. As a consequence, large-scale and cost-effective manufacture of the layers by means of proven printing technology with simultaneously high repeat accuracy of the character reproduction is ensured.

In a technically advantageous embodiment, the functional layer has a plurality of capacitive touch electrodes, each of which is embodied, when a finger of the operator becomes physically close, to generate an analyzable electrical signal. As a consequence, a convenient, intuitive and ergonomic touch functionality of the operating unit can be realized. Moreover, in the functional layer a plurality of conductor tracks are formed, which serve for electrical connection of the individual capacitive touch electrodes to a central electrical connection zone of the operating unit, which can for example be constructed in the form of a multipole connector.

Under normal conditions, when a finger approaches to within less than 5 mm, the capacitive touch electrodes emit an analyzable electrical signal.

Preferably the electrical signals from the capacitive touch electrodes can be conducted, via a printed conductor track assigned to each of these, to at least one electrical connection zone of the functional layer. In this way, the operating unit can be easily and flexibly electrically connected with a control and/or regulating unit of a household appliance. A side-extending, strip-like section of the diffusor foil can function here at the same time as a flexible printed circuit board (FPC). At at least one free end of the strip-like section a reinforcement with a connection zone is preferably formed, such as a multipole connector, etc.

In the case of a further embodiment, the character layer has a plurality of preferably negatively printed and at least in some areas light-permeable characters, with each capacitive touch electrode being preferably associated with a character of the character layer. Due to the congruency between the capacitive touch electrodes and the characters applied to the character layer a clear association results between a function desired, and to be triggered, by an operator or user and the touch electrode concerned.

Preferably, each character of the character layer can be individually illuminated by means of at least one light-emitting diode arranged on a printed circuit board of the LED unit. As a consequence, for example following the triggering by the user of the capacitive electrode associated with a character, the character may light up briefly or continuously as confirmation. Furthermore, the individual illumination capability of the characters allows convenient operation even under difficult lighting conditions, such as strong sunlight.

In a favorable development the printed circuit board of the LED unit has at least one numeric or alphanumeric display for illuminating a character. In this way, numbers or even complete text messages can be displayed to the user by means of the LED unit.

In a technically favorable development each light-emitting diode and each numeric or alphanumeric display of the LED unit has a light well as part of a light guide. In this way, optical crosstalk between light signals of closely adjacent light-emitting diodes or alphanumeric LED displays, as in the form of 7-segment displays, 5×7 dot-matrix displays, etc., is avoided. The light wells can have a mirrored interior surface in at least certain areas.

Preferably, the printed functional layer is covered by a protective layer at least in certain areas. In this way, the capacitive touch electrodes formed by screen printing within the functional layer and the associated electrical conductor tracks are permanently protected from harmful oxidative environmental influences, such as humidity etc., and mechanical damage. The protective layer can, for example, be realized using a protective foil or a protective lacquer.

Preferably, the diffusor foil is established in the region of a parallel section and in a connecting section is flexibly bendable and/or rotatable at least in certain areas. In this way, a spatially flexible electrical connection between the operating unit and an optional, higher-level, electronic control and/or regulating unit is possible. In a connecting section the diffusor foil is preferably reinforced by a reinforcement, to allow the insertion into an electrical connector or plug socket, or similar.

In an advantageous technical development, it is provided that the printed circuit board and the light guide are fixedly connected with the touch-sensitive unit to create the integrated operating unit. In this way, the LED unit and the touch-sensitive unit form a structurally compact, integral unit. The connection can take place by means of an adhesive layer formed at least in certain areas between the protective layer and the light guide.

Preferably the character layer is covered by a light-permeable cover. As a consequence, mechanical damage to the character layer, for example from operational wear, scratches from falling objects, bleaching solar radiation, and so on, is excluded. Furthermore, the ingress of moisture, foreign particles and similar into the operating unit is prevented. In the event of application of the operating unit in a hob, the light-permeable cover is preferably realized by the glass area for cooking utensils.

A preferred exemplary embodiment of the invention is described in more detail below with the aid of schematic figures, in which:

DETAILED DESCRIPTION OF THE INVENTION

Figure 1:
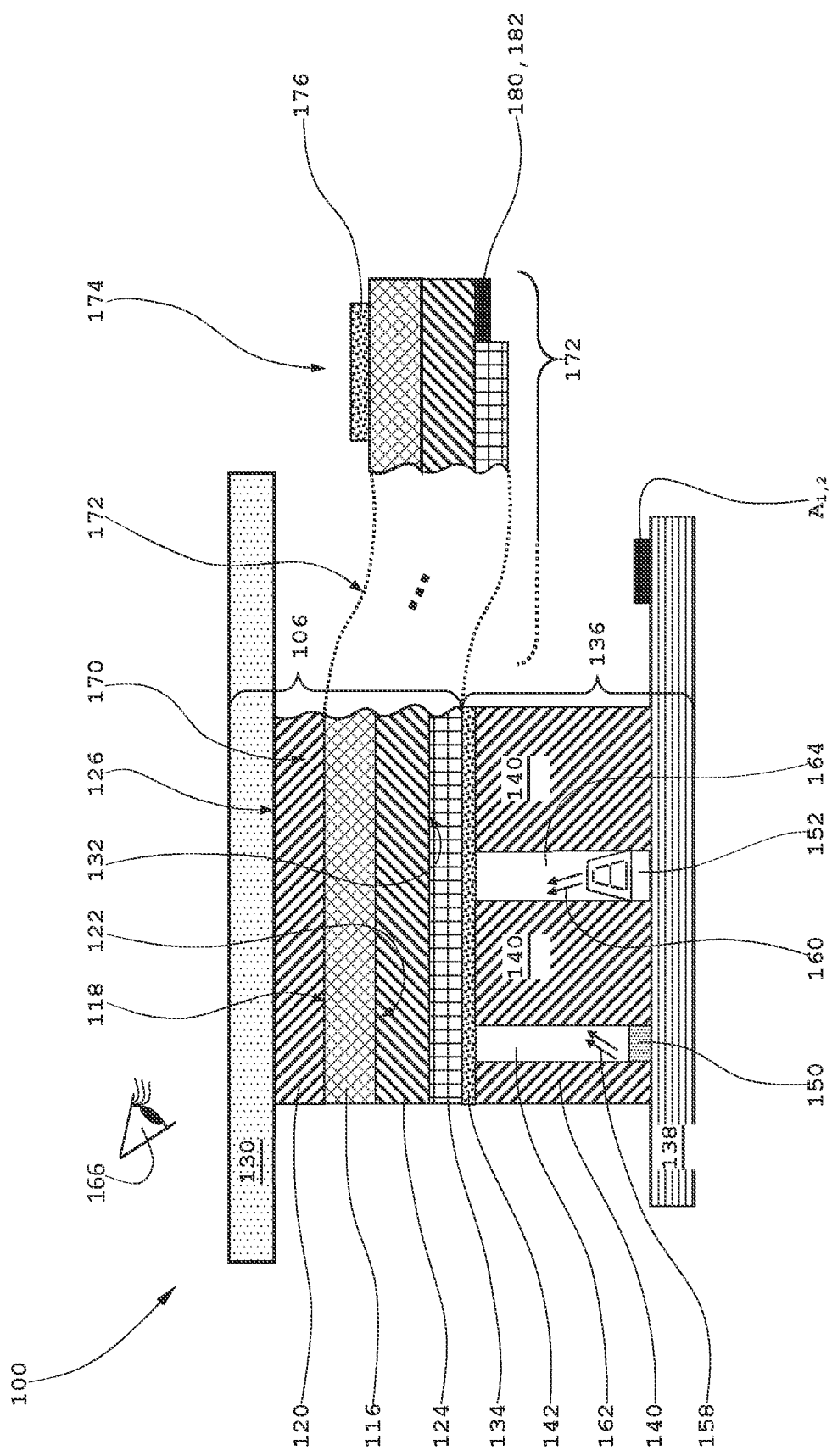
FIG. 1 shows a highly schematic cross-section of an operating unit according to the invention.

FIG. 1 shows a highly schematic cross-section of an operating unit according to the invention. An operating unit 100 for a household appliance (not shown), such as a hob, comprises inter alia a touch-sensitive unit 106 with a light-permeable, flexible, and foil-like diffusor foil 116. A top side 118, facing a user or an operator (not shown), of the diffuser foil 116 is provided with a character layer 120 that is substantially light-permeable apart from printed symbols. An underside 122 of the diffusor foil 116 directed away from the top side 118 of the diffuser foil 116 is provided with a similarly printed functional layer 124, having a plurality of electrical conductor tracks and capacitive touch electrodes (not shown). The functional layer 124 is similarly light-permeable apart from the printed conductor tracks and capacitive touch electrodes. A top side 126 of the character layer 120 is covered by a light-permeable cover 130 which, for example, can be formed from a heat-resistant glass or a light-permeable plastic. An underside 132 of the functional layer 124 of the diffusor foil 116 is at least in certain areas covered with a thin, similarly light-permeable protective layer 134, to protect the functional layer 124 of the diffusor foil 116 from harmful environmental influences, such as wear, short-circuits, or corrosive effects. The protective layer 134 can for example be formed by a lacquer, a laminated plastic foil or similar. Within the character layer 120 the symbols required for operating the household appliance are formed as a plurality of characters.

Beneath the touch-sensitive unit 106 is an LED unit 136, which essentially has a rigid printed circuit board PCB 138, a block-like light guide 140, and a thin, light-permeable adhesive layer 142 for the bonded connection of the LED unit 136 with the underside protective layer 134 of the functional layer 124 of the touch-sensitive unit 106. The LED unit 136 of the operating unit 100 serves primarily for backlighting the symbols or the individual characters of the character layer 120 of the diffusor foil 116.

On the printed circuit board 138 of the LED unit 136, merely by way of example here, at least one LED 150, a numeric or alphanumeric display 152, and an electrical connection zone $A_1$, are arranged. The connection zone $A_1$ comprises a plurality of electrical contacts, of which here just one contact $A_2$ is graphically shown and considered representative of all others. The numeric display or alphanumeric display 152 can, for example, be realized with a 7-segment display or with a 5×7 dot-matrix display.

The adhesive layer 142, the protective layer 134, the functional layer 124, the supporting diffusor foil 116, and the cover 130 are essentially in each case fully light-permeable, with a foil-like and flexible nature. The character layer 120 is light-impermeable except for the printed symbols or characters, so that when the LED unit 150 has been activated the symbols or characters have a negative or inverted appearance to the eye 166. This means that the characters appear brightly lit in front of the character layer that is otherwise printed in black, for example.

The LED 150 and the numeric or alphanumeric display 152 emit light 158, 160 or light signals for back-lighting of characters of the character layer 120 and thereby for visualization of an operating status of the household appliance. The light 158, 160 in each case passes through an associated light well 162, 164 within the block-like light guide 140, penetrates the adhesive layer 142, the protective layer 134, the diffusor foil 116, the character layer 120 and finally the cover 130 and reaches the eye 166 of the user or operator of the household appliance equipped with the operating panel 100. Due to the parallel spacing and thus optical isolation from one another of the light wells 162, 164 crosstalk between the light 158, 160 or light signals emitted by the LED 150 and/or the 7-segment display is avoided. Furthermore, oblique irradiation of bright ambient light into the LED unit 136 and thus an outshining of the LED 150 or the numeric or alphanumeric display 152 is avoided.

In the region of the light guide 140, the touch-sensitive unit 106 and the LED unit run in a parallel portion 170 substantially parallel at a distance from one another between the plate-like transparent cover 130 and the similarly rigid printed circuit board 138 of the LED unit 150.

The parallel section 170 merges laterally into a connecting section 172 and a free adjoining section 174 which in turn adjoins this, so that the operating unit for example can be connected in a spatially flexible manner with an electronic control and/or regulating unit of the household appliance. Here, for example, the top side 118 of the diffusor foil 116 in the region of the adjoining section 174 has a plate-like reinforcement 176, wherein on the underside 132 of the functional layer 124 directed away from the reinforcement 176 a central electrical connection zone 180 is formed, which can comprise a plurality of electrical contacts, of which here only one electrical contact 182 is indicated graphically and is considered representative of all the others. In the region of the connecting section 172 the touch-sensitive unit 106 constitutes a flexible printed circuit board, while the printed circuit board 138 is of a rigid nature throughout.

By means of the flexible connecting section 172 the touch-sensitive unit 106 is electro-conductively connected to the LED unit 136 by means of the connection zone 180 and the electrical contacts $A_2$ of the connection zone $A_1$.

The diffusor foil 116, acting as a light distributor, of the touch-sensitive unit 106, apart from the electrical functional layer 124 for realizing the touch sensitivity, also comprises the character layer 120 with the printed characters required for operator guidance or the necessary symbols, which compared to previously known solutions allows a design which is structurally considerably simpler, easier to manufacture and ultimately more cost-effective. Furthermore, an increased optical performance of the operating unit 100 results since, due to the diffusor foil 116 with its threefold functionality (uniform light distribution, character layer and functional layer), fewer foils and adhesive layers are required, allowing a reduction in undesired optical reflections and losses and an exceptional display contrast of the operating unit 100.

Figure 2:
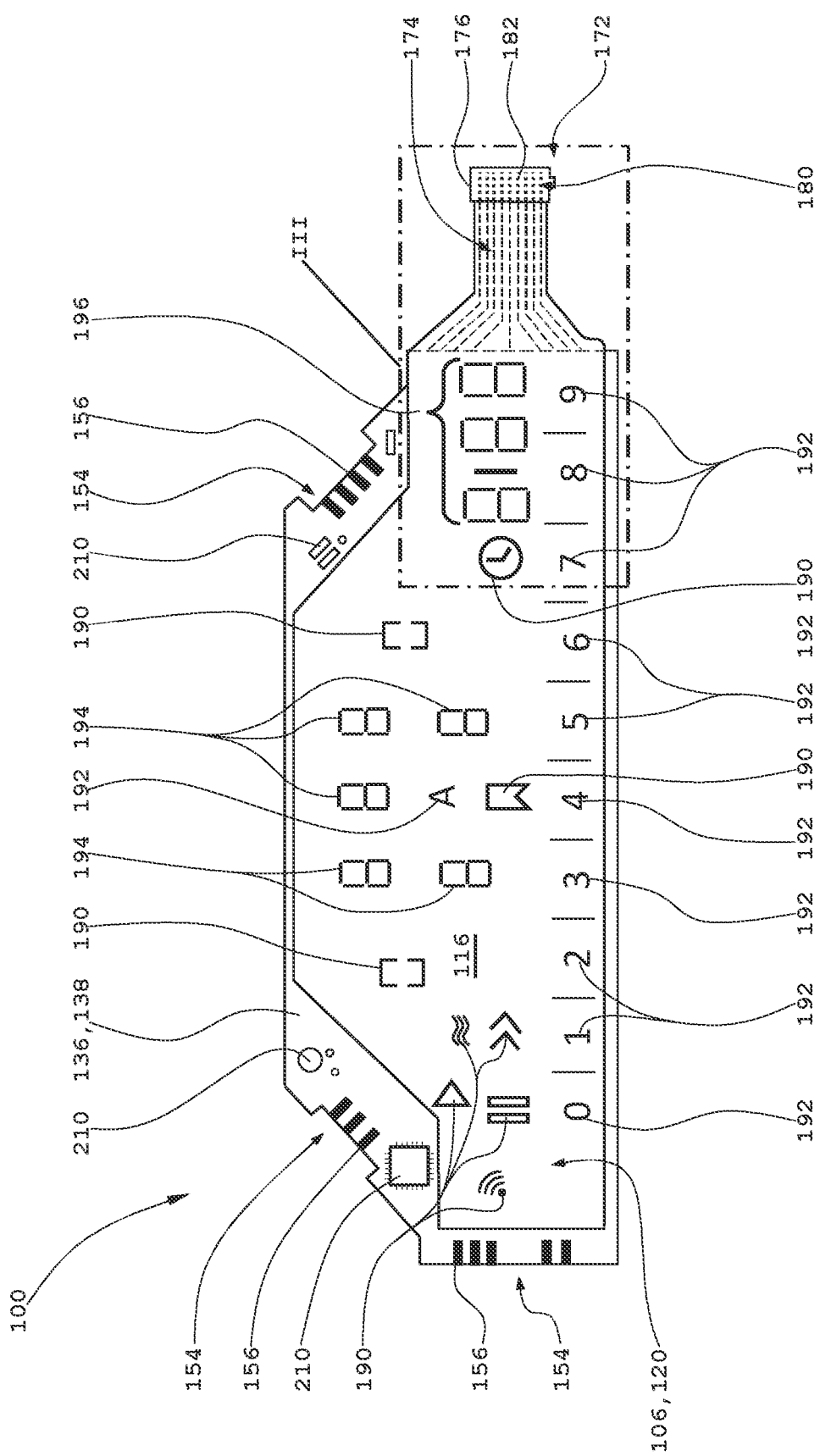
FIG. 2 shows a plan view of the operating unit of FIG. 1 with touch-sensitive unit and its diffusor foil with printed character layer.

FIG. 2 illustrates a plan view of the operating unit of FIG. 1 with touch-sensitive unit and its diffusor foil with printed character layer. The character layer 120 of the diffusor foil 116 with a plurality of characters 190, 192, 194, 196, 198 200 created by screen printing, passes above the rigid printed circuit board 138 of the LED unit 136 of the operating unit 100. The characters 190 are simply purely exemplary symbols or pictograms, the characters 192 represent unalterable Arabic numerals or Roman letters, the characters 194 represent variable Arabic numerals between 0 and 9 and if necessary certain Roman letters (7-segment display), and the characters 196, for example, represent a variable digital clock, a timer or similar. Essentially, the character layer 120 of the diffusor foil 116 can have any characters, for example, fixed letters, fixed numerals, special characters, pictograms, variable 7-segment numerals or variable alphanumeric 5×7 dot-matrix characters, which for emphasis can preferably be individually lit or backlit by means of the LED unit 136.

At its free end, the connecting section 172 has the adjoining section 174 with the reinforcement 176 and the central electrical connection zone 180 or a connector with a plurality of electrical contacts, of which just one electrical contact is provided with reference character 182 to represent all the others.

The characters 190, 192, 194 and 196 are in each case designed to be light-permeable. For example, the symbol characters 190 can in each case be backlit by at least one LED, which is designed according to the LED 150 of FIG. 1. The same applies to the characters 192 in the form of fixed Arabic numerals or Roman letters. The characters 194 in the form of variable numerals can, for example, in each case be backlit by a numeric display or a 7-segment display according to the numeric display 152 of FIG. 1. The same considerations apply accordingly to the other characters 194, 196 in the character layer 120 of the diffusor foil 124.

By means of the electrical connection zones 154 of the printed circuit board 138 with in each case a plurality of electrical contacts, of which in each case just one electrical contact provided with the reference character 156 is considered representative, the operating unit 100 can, for example, be electrically connected with an electronic control and/or regulating unit (not shown) or other electrical components of the household appliance.

Apart from the at least one LED 150 and the at least one numeric or alphanumeric display 152 from FIG. 1, a plurality of further electronic components are arranged on the rigid printed circuit board 138 of the operating unit 100.

Figure 3:
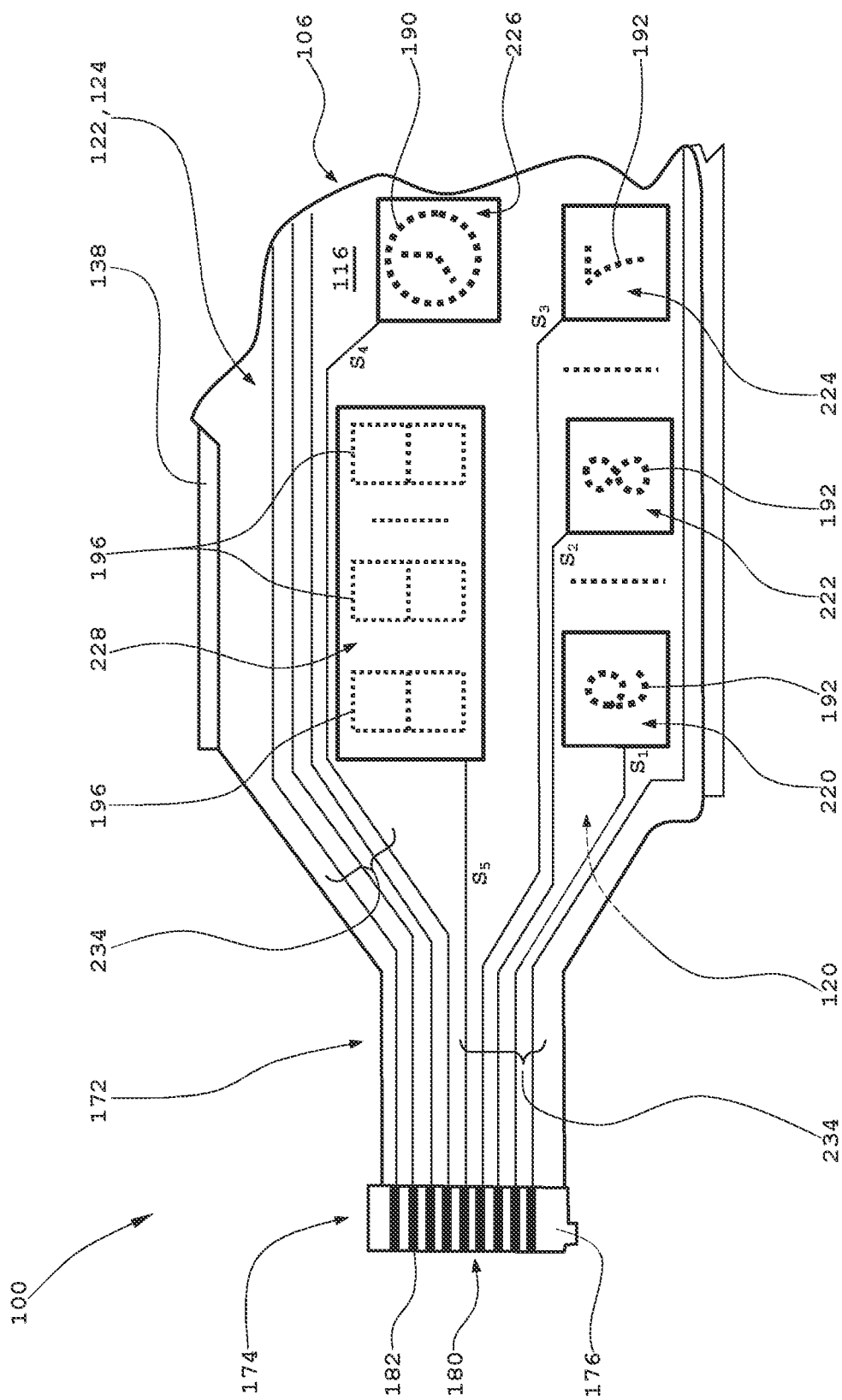
FIG. 3 shows a bottom view of the diffusor foil of the operating unit of FIG. 2 with printed functional layer in the region of detail II of FIG. 2.

FIG. 3 shows a bottom view of the diffusor foil of the operating unit of FIG. 2 with printed functional layer in the region of detail II of FIG. 2. The diffusor foil 116 passes above the rigid printed circuit board 138 of the operating unit 100. The connecting section 172 merges into the adjoining section 174 with the reinforcement 176 and the central electrical connection zone 180 with the electrical contact 182 representative of all other electrical contacts. In the electrical functional layer 124 of the diffusor foil 116 or on the underside 122 of the diffusor foil 116, merely by way of example here, five electrically conducting, capacitive touch electrodes 220, 222, 224, 226 and 228 are preferably produced by screen printing.

The first frame-shaped capacitive touch electrode 220 is arranged in the region of the character 192 indicated by dots, representing the Arabic numeral '9', with the character layer 120, which is hidden here, passing below the diffusor foil 116. Accordingly, the frame-shaped capacitive touch electrode 222 is associated with the character 192, representing the Arabic numeral '8'. The frame-shaped capacitive touch electrode 224 comprises the character 192 for the number '7'. The frame-shaped capacitive touch electrode 226 comprises the character 190, which here, for example, symbolizes an analog clock and the frame-shaped capacitive touch electrode 228 comprises the character 194 in the form of a digital clock or a timer.

With the aid of the capacitive touch electrodes 220, 222, 224, 226, 228, when the operator's finger is sufficiently close, an electronically analyzable electric signal $S_{1,\ldots,5}$ can be generated in each case. Moreover, in the electrical functional layer 124 of the diffusor foil 116 or on the underside 122 of the diffusor foil 116, there pass a plurality of conductor tracks similarly produced by screen printing, of which just one conductor track 234 is drawn to be representative for all others with reference character 234.

With the aid of the conductor tracks 234, the individual electrical signals $S_{1,\ldots,5}$ from the capacitive touch electrodes 220, 222, 224, 226, 228, are passed here to a respective associated electrical contact of the central electrical connection zone 180. When an operator's finger approaches one of the capacitive touch electrodes 220, 222, 224, 226 or 228 the respective electrical signal $S_{1,\ldots,5}$, is generated which, by means of the electrical conductor tracks 234, is passed to the electrical connection zone 180. With the aid of the control and/or regulating unit (not shown) an action corresponding to the character associated with the respective touch electrode 220, 222, 224, 226, 228 can then be triggered.

An optical confirmation of the action selected by the operator can be provided, for example, by the backlighting of the corresponding symbol of the operating unit 100 by means of an associated LED or numeric or alphanumeric display of the LED unit. For example, upon activating the capacitive touch electrode 226 with the character 190 associated with this in the form of an analog clock, the setting of an internal clock of the household appliance can be initiated with the aid of the control and/or regulating unit.

The functioning of capacitive touch electrodes will be sufficiently familiar from the prior art to a personal skilled in the art working in electronics, such that their detailed functioning requires no further explanation at this point for reasons of succinctness and brevity.

The operating unit 100 according to the invention has a simplified design, allowing a cost-optimized manufacturing process with the simultaneous improvement in optical display quality.

The invention relates to an operating unit 100 for a household appliance having a touch-sensitive unit 106 and an LED unit 136 positioned on the rear thereof. According to the invention, the touch-sensitive unit 106 is formed with a diffuser foil 116, the top side 118 of which, facing an operator, is provided with a printed character layer 120 and the underside 122 of which, directed away therefrom, is provided with a printed functional layer 124. This leads to a simpler structure of the operating unit 100 with a smaller number of components, which permits a cost-optimized manufacturing process, and also a higher display contrast with the simultaneous reduction of undesirable reflection effects.

LIST OF REFERENCE CHARACTERS

100 Operating unit
106 Touch-sensitive unit
116 Diffusor foil
118 Top side (diffusor foil)
120 Character layer (diffusor foil)
122 Underside (diffusor foil)
124 Functional layer
126 Top side (character layer)
130 Cover
132 Underside (functional layer)
134 Protective layer (diffusor foil)
136 LED unit
138 Rigid printed circuit board
140 light guide
142 Adhesive layer (LED unit)
150 LED
152 Numeric or alphanumeric display
154 Electrical connection zone
156 Electrical contact
158 Light
160 Light
162 Light well
164 Light well
166 Human eye
170 Parallel section
172 Connecting section
174 Adjoining section
176 Reinforcement
180 Electrical connection zone
182 Electrical contact
190 Character (symbol)
192 Character (fixed Arabic numeral)
194 Character (7-segment display)
196 Character (clock or timer)
210 Electronic component
220 Capacitive touch electrode
222 Capacitive touch electrode
224 Capacitive touch electrode
226 Capacitive touch electrode
228 Capacitive touch electrode
234 Electrical conductor track
$S_1, \ldots, _5$ Electrical signal (capacitive touch electrode)
$A_1$ Electrical connection zone
$A_2$ Electrical contact

The invention claimed is:

1. An operating unit for a household appliance, comprising:
    a touch-sensitive unit formed with a supporting diffusor foil; and
    a light-emitting diode (LED) unit disposed on a rear side of said touch-sensitive unit;
    said diffusor foil of said touch-sensitive unit having a top side facing toward an operator and carrying a printed character layer; and
    said diffusor foil having an underside directed away from said printed character layer and carrying a printed functional layer; and
    a light-permeable protective layer covering said printed functional layer at least in certain areas thereof, and a light-permeable adhesive layer connecting said LED unit to said touch-sensitive unit at said protective layer.

2. The operating unit according to claim 1, wherein said character layer and said functional layer of said diffusor foil are screen printed layers.

3. The operating unit according to claim 1, wherein said functional layer comprises a plurality of capacitive touch electrodes, and each capacitive touch electrode of said capacitive touch electrodes is configured, when a finger of the operator comes physically close, to generate an analyzable electrical signal.

4. The operating unit according to claim 3, wherein said functional layer further comprises a printed conductor track associated with said each capacitive touch electrode of said capacitive touch electrodes and at least one electrical connection zone, and wherein the electrical signal from said each capacitive touch electrode is conducted via said printed conductor track associated therewith to said at least one electrical connection zone.

5. The operating unit according to claim 3, wherein said character layer comprises a plurality of negatively printed and at least partially light-permeable characters, and wherein said each capacitive touch electrode is associated with each of the plurality of negatively printed and at least partially light-permeable characters of said character layer.

6. The operating unit according to claim 5, wherein said LED unit comprises a plurality of light-emitting diodes arranged on a printed circuit board, and wherein said each of the plurality of negatively printed and at least partially light-permeable characters of said character layer is individually lit by way of at least one light-emitting diode arranged on said printed circuit board.

7. The operating unit according to claim 6, wherein said printed circuit board of said LED unit comprises at least one numeric display of a plurality of numeric displays or alphanumeric display of a plurality of alphanumeric displays for illuminating said each of the plurality of negatively printed and at least partially light-permeable characters of said character layer.

8. The operating unit according to claim 7, wherein each light-emitting diode of the plurality of light-emitting diodes and each numeric display of said plurality of numeric displays or each alphanumeric display of said plurality of alphanumeric displays of said LED unit has a light well as part of a light guide.

9. The operating unit according to claim 1, wherein said diffusor foil is substantially rigid in a region of a parallel section and said diffuser foil is at least partly flexibly bendable and/or rotatable in a connecting section.

10. The operating unit according to claim 1, wherein said LED unit has a light guide and a plurality of light-emitting diodes arranged on a printed circuit board, and wherein said printed circuit board and said light guide are fixedly connected with said touch-sensitive unit to form an integrated operating unit.

11. The operating unit according to claim 1, further comprising a light-permeable cover disposed on said character layer.

* * * * *